United States Patent
Behzad et al.

(10) Patent No.: US 7,679,449 B2
(45) Date of Patent: Mar. 16, 2010

(54) METHOD AND SYSTEM FOR A HIGHLY EFFICIENT POWER AMPLIFIER UTILIZING DYNAMIC BIASING AND PREDISTORTION

(75) Inventors: Arya Behzad, Poway, CA (US); Ali Afashi, San Diego, CA (US); Vikram Magoon, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/191,938

(22) Filed: Aug. 14, 2008

(65) Prior Publication Data
US 2009/0033425 A1    Feb. 5, 2009

Related U.S. Application Data

(63) Continuation of application No. 11/618,877, filed on Dec. 31, 2006, now Pat. No. 7,492,223.

(60) Provisional application No. 60/868,818, filed on Dec. 6, 2006.

(51) Int. Cl.
*H03G 3/10* (2006.01)
(52) U.S. Cl. .................. 330/285; 330/136; 330/261; 330/149
(58) Field of Classification Search ............. 330/285, 330/136, 261, 149
See application file for complete search history.

(56) References Cited

U.S. PATENT DOCUMENTS

| | | | |
|---|---|---|---|
| 6,025,754 A | 2/2000 | Czora | |
| 6,078,226 A * | 6/2000 | Ajjikuttira | 331/179 |
| 6,803,822 B2 | 10/2004 | Kim et al. | |
| 6,831,517 B1 | 12/2004 | Hedberg et al. | |
| 6,859,102 B2 * | 2/2005 | Tichauer | 330/285 |
| 7,057,462 B2 * | 6/2006 | Kang et al. | 330/289 |
| 7,164,310 B1 * | 1/2007 | Nauleau et al. | 327/540 |
| 7,259,629 B2 * | 8/2007 | Redman-White et al. | 330/284 |
| 7,400,203 B2 * | 7/2008 | Ojo et al. | 330/305 |

* cited by examiner

*Primary Examiner*—Patricia Nguyen
(74) *Attorney, Agent, or Firm*—McAndrews, Held & Malloy

(57) ABSTRACT

Aspects of a method and system for a highly efficient power amplifier (PA) utilizing dynamic biasing and predistortion are presented. Aspects of the system may include a processor that enables computation of a value of a variable bias component of a bias current based on a bias slope value and an amplitude of an envelope input signal. The processor may enable computation of a value of the bias current based on the selected constant bias current component value and the variable bias current component value. A PA may enable generation of an output signal in response to a generated baseband signal by utilizing the bias current to amplify an amplifier input signal. The bias current may be generated based on the envelope input signal. A feedback signal may be generated based on the output signal, which may be used to predistort a subsequent baseband signal.

36 Claims, 12 Drawing Sheets

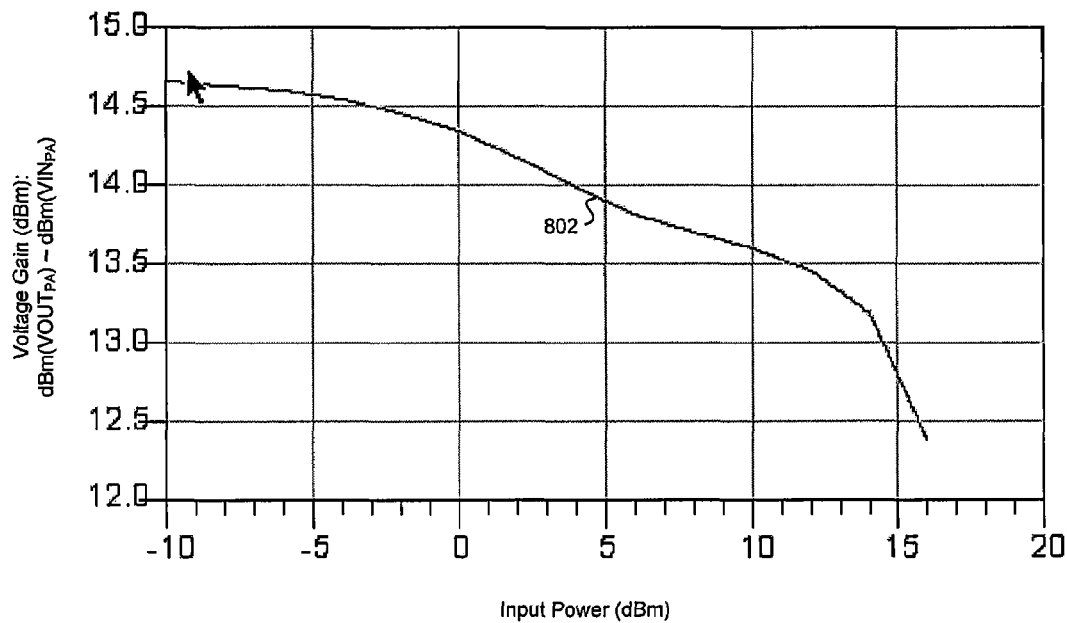
FIG. 8A
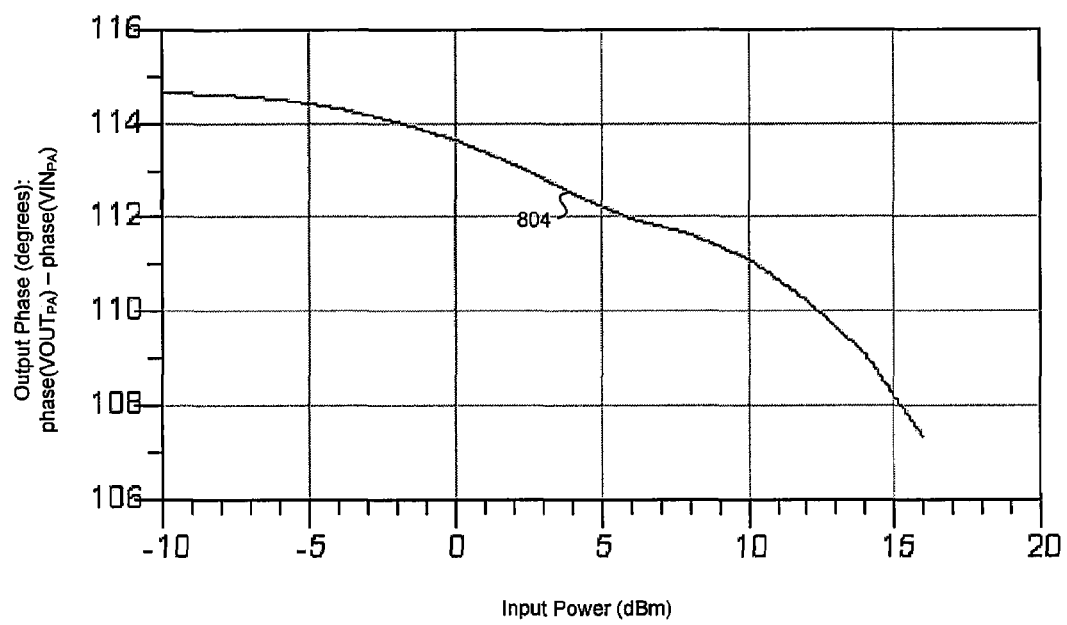
FIG. 8B
FIG. 8

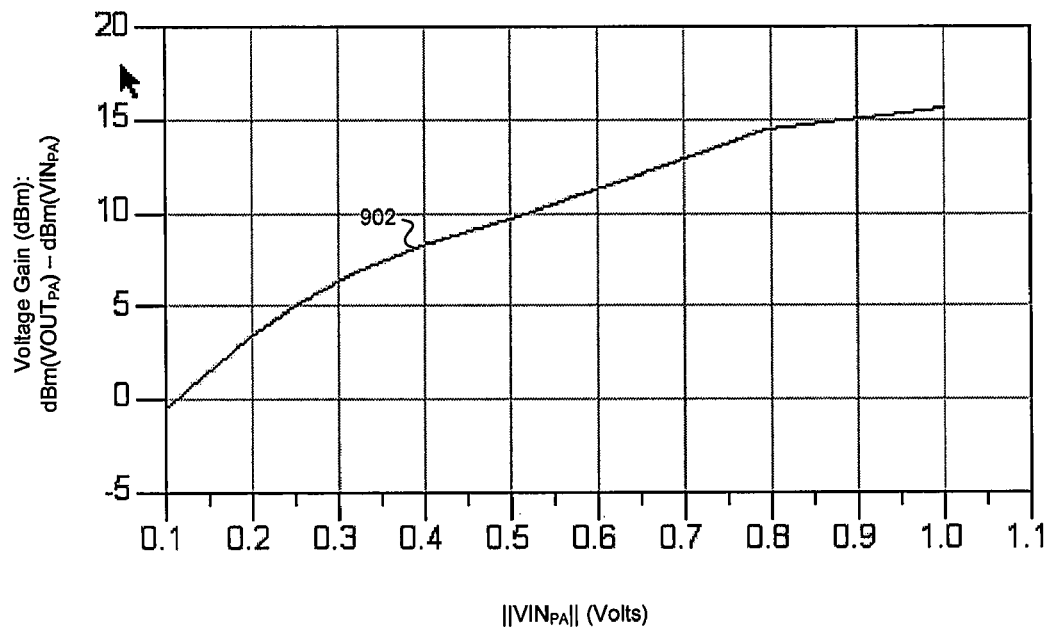
FIG. 9A
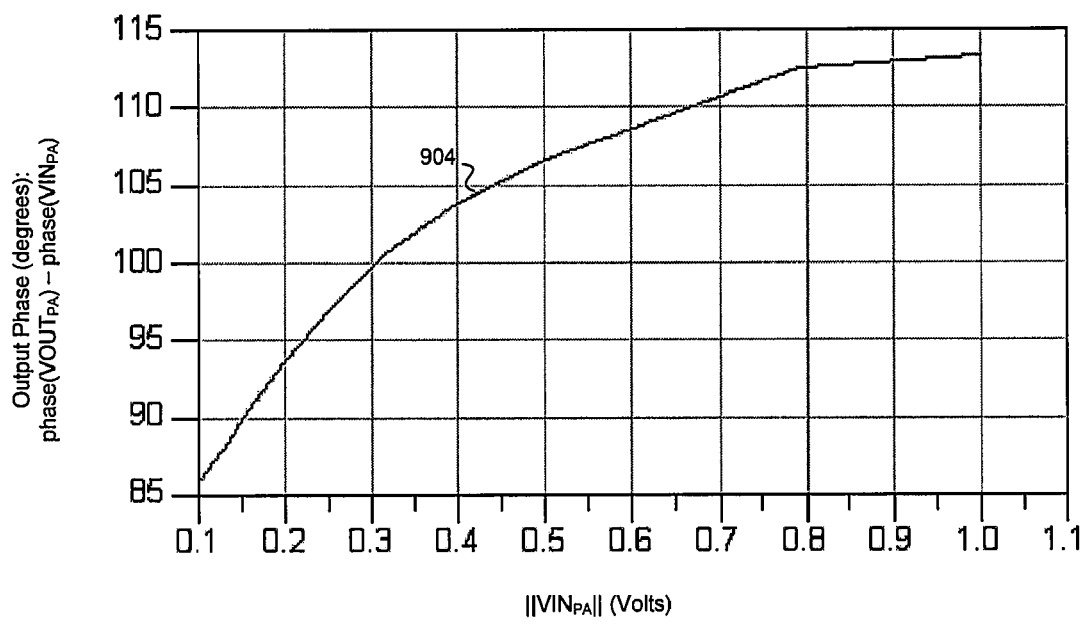
FIG. 9B
FIG. 9

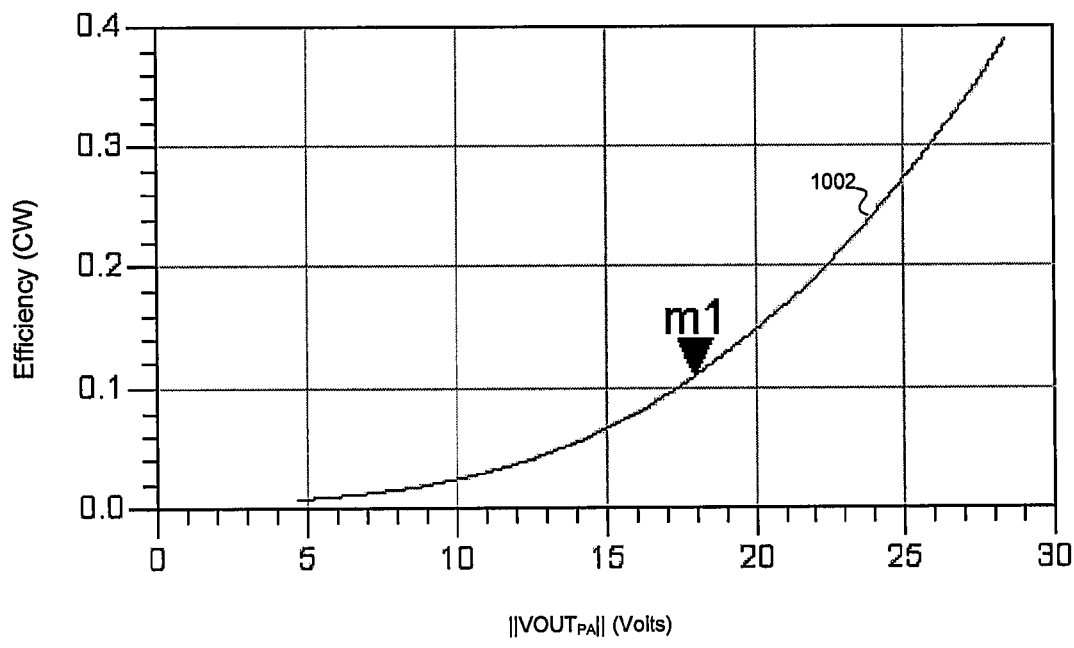
FIG. 10A
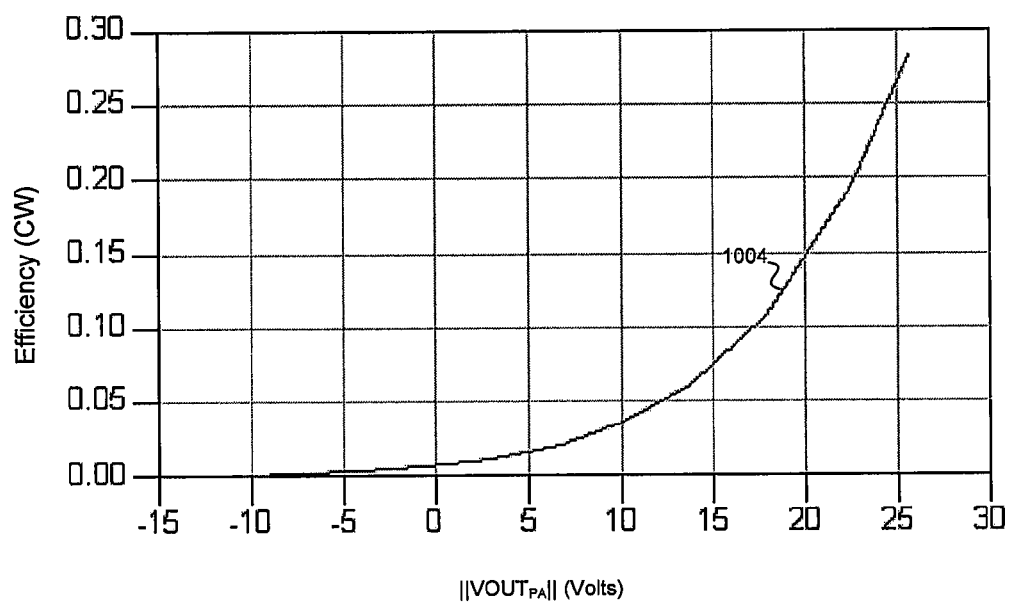
FIG. 10B
FIG. 10

METHOD AND SYSTEM FOR A HIGHLY EFFICIENT POWER AMPLIFIER UTILIZING DYNAMIC BIASING AND PREDISTORTION

CROSS-REFERENCE TO RELATED APPLICATIONS/INCORPORATION BY REFERENCE

This application is a continuation of U.S. application Ser. No. 11/618,877 filed Dec. 31, 2006 now U.S. Pat No. 7,492,223, which makes reference to, claims priority to, and claims the benefit of U.S. Provisional Application Ser. No. 60/868,818, filed on Dec. 6, 2006.

This application also makes reference to:

U.S. patent application Ser. No. 11/618,876, filed on Dec. 31, 2006.

Each of the above stated applications is hereby incorporated herein by reference in its entirety.

FIELD OF THE INVENTION

Certain embodiments of the invention relate to wireless communications. More specifically, certain embodiments of the invention relate to a method and system for a highly efficient power amplifier utilizing dynamic biasing and predistortion.

BACKGROUND OF THE INVENTION

A power amplifier (PA) circuit may be biased for different modes, or "classes" of operation. Exemplary classes include Class A, Class AB, and Class B. In Class A operation, a PA may be biased such that the PA is in a conducting, or ON, state during 100% of the cycle, or the entire cycle, of the input signal. The bias level is also typically selected such that the PA operates in the most linear portion of the transfer curve, which characterizes the PA circuit. In Class A operation, the output signal from the PA is typically a scaled version of the input signal, where the scaling factor is a function of the gain associated with the PA circuit. However, because of the bias level utilized for Class A operation, the PA is typically in a conducting state even when there is no input signal. Furthermore, even when the PA is amplifying an input signal, the efficiency of the PA may not exceed 50%. For example, each watt of delivered output power, or $P_{out}$, may require two (2) watts of delivered power, $P_{DC}$, from a DC power supply source (such as a battery). One limitation of Class A PA circuits for use in mobile wireless communication systems like wireless local area network (WLAN) systems is that high bias levels often utilized to enable large variations in output power levels may result in unacceptably short battery life and/or high levels of generated thermal heat.

In Class B operation, a PA may be biased such that the PA is in a conducting state during 50%, or half, of the cycle of the input signal. This may result in large amounts of distortion of the input signal in the output signal. In this regard, in Class B operation, the PA may operate in a nonlinear portion of the transfer curve. However, the theoretical efficiency of a Class B PA circuit may reach 78.5%. The higher efficiency of the Class B PA results from the PA being in a non-conducting, or OFF, state half of the time. While the PA is in the OFF state, power dissipation may be theoretically zero (0). One limitation of Class B PA circuits is that distortion levels in output signals may be unacceptably high.

In Class AB operation, a PA may be biased such that the PA is in a conducting state for greater than 50%, but less than 100%, of the cycle of the input signal. In Class AB operation, the PA may be more efficient than in Class A operation, but less efficient than in Class B operation. Furthermore, in Class AB operation, the PA may produce more distortion than in Class A operation, but less than in Class B operation.

A power amplification circuit in a wireless system is typically a large signal device. In WLAN systems, the power amplifier circuit may transmit output signals at average power levels in the range of 10 dBm to 15 dBm, and peak power levels of about 25 dBm, for example. In WLAN systems, which use OFDM or CCK modulation, output power levels may vary widely such that the ratio of the peak power level to the average power level may be large, for example, 12 dB for OFDM and 6 dB for CCK. Because of these large swings in output power levels, power amplifier (PA) circuits may distort the output signal. Distortion, however, is a characteristic, which may be observed in PA circuits that are utilized across a wide range of applications, and may not be limited to PA circuits utilized in wireless systems. There are two metrics, which may be utilized to evaluate the distortion performance of PA circuits. These metrics may be referred to as amplitude modulation to amplitude modulation (AM-AM) distortion, and amplitude modulation to phase modulation (AM-PM) distortion.

The AM-AM distortion provides a measure of the output power level, $p_{out}$, in response to the input power level, $p_{in}$. The input power level, and output power level are each typically measured in units of dBm, for example. In an ideal, non-distorting, PA circuit, the output power level changes linearly in response to a change in the input power level. Thus, for each $\Delta p_{in}$ change in the input power level there may be a corresponding change in the output power level, $\Delta p_{out} \approx \Delta p_{in}$. The AM-AM distortion may be observed when, for example, the output power level in response to a first input power level may be $p_{out1} \approx \alpha p_{in1}$, where the output level in response to a second input power level may be $p_{out2} \approx \beta p_{in2}$, when $\alpha \neq \beta$.

The AM-PM distortion provides a measure of the phase of the output signal in relation to the input signal (or output phase) in response to the input power level. Output phase is typically measured in units of angular degrees. The AM-PM distortion may be observed when, for example, the output phase changes in response to a change in input power level.

When the peak input signal level to a PA circuit is large compared to the average input signal level, or high peak to average ratio, the PA circuit may be biased to accommodate the peak input signal level, $P_{INMAX}$. The value of PDC may be set to enable generation of an RF signal output level from the PA circuit, $P_{RFMAX}$, when the corresponding input signal level is $P_{INMAX}$. Thus, efficiency of the PA circuit may be highest for a given value $P_{DC}$ when the RF signal output level from the PA circuit is $P_{RFMAX}$. However, for high peak to average ratios, the input signal level is typically less than $P_{INMAX}$ for a substantial portion of the time that the PA circuit is operating. Therefore, the average RF signal output level, $P_{RFAVG}$, may be significantly lower than $P_{RFMAX}$. Consequently, the need to support high peak to average ratios may result in low efficiency for the PA circuit.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for a highly efficient power amplifier utilizing dynamic biasing and predistortion, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

BRIEF DESCRIPTION OF SEVERAL VIEWS OF THE DRAWINGS

FIG. 8A is a graph illustrating exemplary voltage gain in a power amplifier circuit without dynamic biasing, which may be utilized in connection with an embodiment of the invention.

FIG. 8B is a graph illustrating exemplary output phase in a power amplifier circuit without dynamic biasing, which may be utilized in connection with an embodiment of the invention.

FIG. 9A is a graph illustrating exemplary voltage gain in a power amplifier circuit with dynamic biasing, in accordance with an embodiment of the invention.

FIG. 9B is a graph illustrating exemplary output phase in a power amplifier circuit with dynamic biasing, in accordance with an embodiment of the invention.

FIG. 10A is a graph illustrating exemplary efficiency for a power amplifier circuit without dynamic biasing, which may be utilized in connection with an embodiment of the invention.

FIG. 10B is a graph illustrating exemplary efficiency for a power amplifier circuit with dynamic biasing, in accordance with an embodiment of the invention.

DETAILED DESCRIPTION OF THE INVENTION

Certain embodiments of the invention may be found in a method and system for a highly efficient power amplifier (PA) utilizing dynamic biasing and predistortion. Various embodiments of the invention may enable a PA circuit to operate in a highly efficient and linear manner for output signals across large peak power level to average power level ratios. Efficiency, $\eta$, for a PA circuit may be defined as in the following equation:

$$\eta = \frac{P_{RF}}{P_{DC}} \qquad [1]$$

where $P_{RF}$ refers to the power level for an RF signal output by a PA circuit in an RF transmitter.

Aspects of the method and system for a highly efficient PA utilizing dynamic biasing and predistortion may comprise detecting input signal levels to the PA and dynamically adjusting the PA input bias current to enable the PA to operate with high efficiency and/or linearity. The dynamically adjusted input bias current may comprise a constant component and a variable component for which the value may vary in response to the detected input signal levels. An envelope detector may detect an amplitude of an input signal to a PA circuit. Based on the detected input signal amplitude, the envelope detector and current generator circuit may dynamically adjust the input bias current to the PA circuit to enable the PA circuit to operate with high efficiency and/or linearity. The bias adjustment may, however, introduce AM-AM distortion and/or AM-PM distortion in the output signal generated by the PA circuit. The output signal may be generated in response to a baseband signal generated by a baseband processor. The baseband processor may receive a feedback signal from the PA circuit that is generated in response to the output signal. The power levels and/or relative phase of subsequent baseband input signals generated by the baseband processor may be modified in response to AM-AM distortion and/or AM-PM distortion detected in the feedback signal. The modification of power levels and/or relative phase of the subsequent baseband input signals may be referred to as predistortion.

Figure 1:
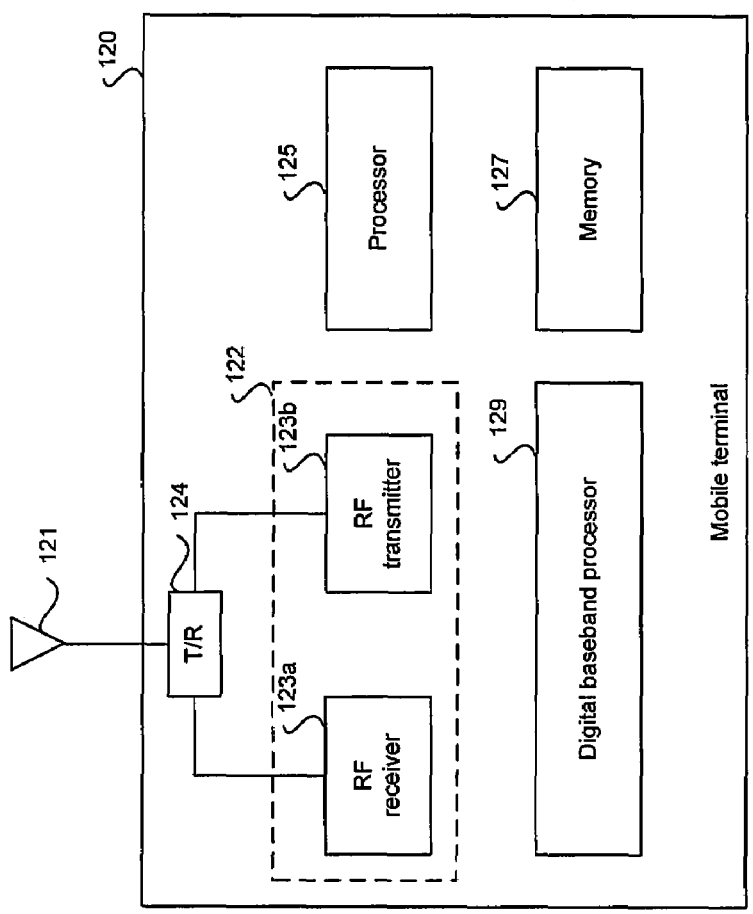
FIG. 1 is a block diagram illustrating and exemplary mobile terminal, which may be utilized in connection with an embodiment of the invention.

FIG. 1 is a block diagram illustrating and exemplary mobile terminal, which may be utilized in connection with an embodiment of the invention. Referring to FIG. 1, there is shown mobile terminal 120 that may comprise an RF receiver 123a, an RF transmitter 123b, a digital baseband processor 129, a processor 125, and a memory 127. In some embodiments of the invention, the RF receiver 123a, and RF transmitter 123b may be integrated into an RF transceiver 122, for example. A single transmit and receive antenna 121 may be communicatively coupled to the RF receiver 123a and the RF transmitter 123b. A switch 124, or other device having switching capabilities may be coupled between the RF receiver 123a and RF transmitter 123b, and may be utilized to switch the antenna 121 between transmit and receive functions.

The RF receiver 123a may comprise suitable logic, circuitry, and/or code that may enable processing of received RF signals. The RF receiver 123a may enable receiving RF signals in frequency bands utilized by various wireless communication systems, such as WLAN, Bluetooth, GSM and/or CDMA, for example.

The digital baseband processor 129 may comprise suitable logic, circuitry, and/or code that may enable processing and/or handling of baseband signals. In this regard, the digital baseband processor 129 may process or handle signals received from the RF receiver 123a and/or signals to be transferred to the RF transmitter 123b for transmission via a wireless communication medium. The digital baseband processor 129 may also provide control and/or feedback information to the RF receiver 123a and to the RF transmitter 123b, based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission via the wireless communication medium.

The RF transmitter 123b may comprise suitable logic, circuitry, and/or code that may enable processing of RF signals for transmission. The RF transmitter 123b may enable transmission of RF signals in frequency bands utilized by various wireless communications systems, such as GSM and/or CDMA, for example.

The processor 125 may comprise suitable logic, circuitry, and/or code that may enable control and/or data processing operations for the mobile terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, which may be utilized to control the operation of at least one block in the mobile terminal 120. For example, the memory 127 may comprise information necessary to configure the RF receiver 123a to enable receiving RF signals in the appropriate frequency band.

Figure 2A:
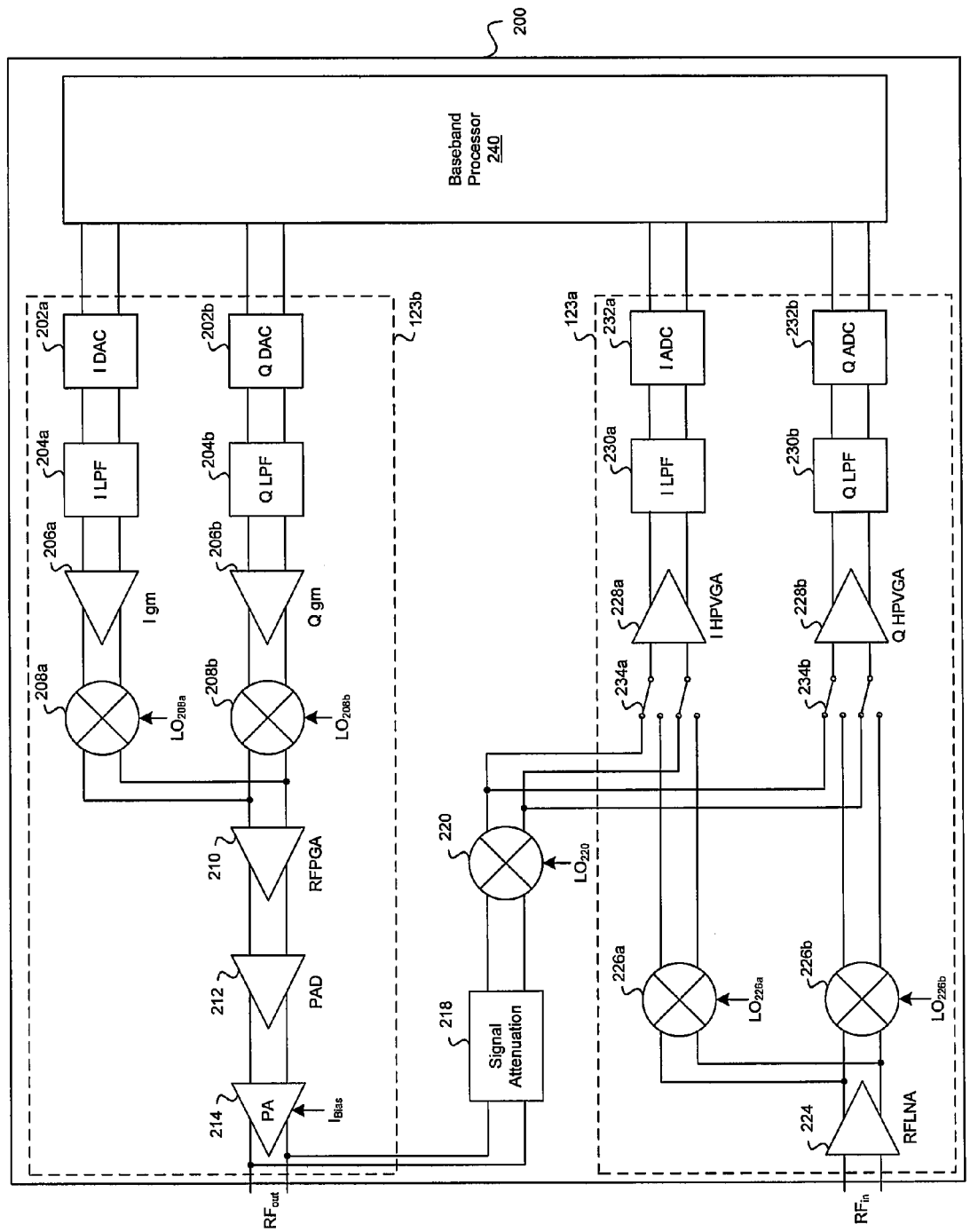
FIG. 2A is an exemplary block diagram illustrating an RF transceiver utilizing feedback for predistortion calibration with a single feedback mixer, in accordance with an embodiment of the invention.

FIG. 2 is an exemplary block diagram illustrating an RF transceiver utilizing feedback for predistortion calibration, in accordance with an embodiment of the invention. Referring to FIG. 2, there is shown an RF transceiver 200. The RF transceiver 200 may comprise an RF receiver 123a, an RF transmitter 123b, a signal attenuation block 218, a feedback mixer 220, and a baseband processor 240. The RF transmitter 123b may comprise a power amplifier (PA) 214, a power amplifier driver (PAD) 212, an RF programmable gain amplifier (RFPGA) 210, a transmitter In-phase signal (I) mixer 208a, a transmitter Quadrature-phase signal (Q) mixer 208b, an I transconductance amplifier (gm) 206a, a Q gm 206b, an I low pass filter (LPF) 204a, a Q LPF 204b, an I digital to analog converter (I DAC) 202a, and a Q DAC 202b. The RF receiver 123a may comprise an RF low noise amplifier (RFLNA) 224, a receiver I mixer 226a, a receiver Q mixer 226b, an I path selector switch 234a, a Q path selector switch 234b, an I high pass variable gain amplifier (HPVGA) 228a, a Q HPVGA 228b, an I LPF 230a, a Q LPF 230b, an I analog to digital converter (DAC) 232a, and a Q DAC 232b.

The signal attenuation block 218 may comprise suitable logic, circuitry, and/or code that may enable generation of an output signal, the amplitude and/or power level of which may be based on an input signal after insertion of a specified level of attenuation. In various embodiments of the invention the attenuation level may be programmable over a range of attenuation levels. In an exemplary embodiment of the invention, the range of attenuation levels may comprise −32 dB to −40 dB, although various embodiments of the invention may not be limited to such a specific range. In an exemplary embodiment of the invention, the signal attenuation block 218 may receive a differential input signal and output a differential output signal.

The feedback mixer 220 may comprise suitable logic, circuitry, and/or code that may enable mix down of an input signal. The feedback mixer 220 may utilize an input local oscillator signal labeled as $LO_{220}$ (in FIG. 2) to mix down the input signal. The frequency of the signal $LO_{220}$ may be selected from a frequency band utilized by a specified wireless communication system, for example WLAN—the same frequency as $LO_{208a}$ and $LO_{208b}$.

The PA 214 may comprise suitable logic, circuitry, and/or code that may enable amplification of input signals to generate a transmitted signal of sufficient signal power (as measured by dBm, for example) for transmission via a wireless communication medium. The PA 214 may receive an input bias current labeled as $I_{Bias}$ in FIG. 2. The bias current level may be selected to enable efficient and/or linear operation of the PA 214 across a range of input signal power levels and/or amplitudes. In an exemplary embodiment of the invention, the PA 214 may receive a differential input signal and output a differential output signal.

The PAD 212 may comprise suitable logic, circuitry, and/or code that may enable amplification of input signals to generate an amplified output signal. The PAD 212 may be utilized in multistage amplifier systems wherein the output of the PAD 212 may be an input to a subsequent amplification stage. In an exemplary embodiment of the invention, the PAD 212 may receive a differential input signal and output a differential output signal.

The RFPGA 210 may comprise suitable logic, circuitry, and/or code that may enable amplification of input signals to generate an amplified output signal, wherein the amount of amplification, as measured in dB for example, may be determined based on an input control signal. In various embodiments of the invention, the input control signal may comprise binary bits. In an exemplary embodiment of the invention, the RFPGA 210 may receive a differential input signal and generate a differential output signal.

The transmitter I mixer 208a may comprise suitable logic, circuitry, and/or code that may enable generation of an RF signal by upconversion of an input signal. The transmitter I mixer 208a may utilize an input local oscillator signal labeled as $LO_{208a}$ to upconvert the input signal. The upconverted signal may be an RF signal. The transmitter I mixer 208a may produce an RF signal for which the carrier frequency may be equal to the frequency of the signal $LO_{208a}$. In an exemplary embodiment of the invention, the transmitter I mixer 208a may receive a differential input signal and generate a differential output signal.

The transmitter Q mixer 208b may be substantially similar to the transmitter I mixer 208a. The transmitter Q mixer 208b may utilize an input local oscillator signal labeled as $LO_{208b}$ in quadrature (in FIG. 2) to upconvert the input signal.

The I gm 206a may comprise suitable, logic, circuitry, and/or code that may enable generation of an output current, the amplitude of which may be proportional to an amplitude of an input voltage, wherein the measure of proportionality may be determined based on the transconductance parameter, $gm_I$, associated with the I gm 206a. In an exemplary embodiment of the invention, the I gm 206a may receive a differential input signal and output a differential output signal.

The Q gm 206b may be substantially similar to the I gm 206a. The transconductance parameter associated with the Q gm 206b is $gm_Q$.

The I LPF 204a may comprise suitable logic, circuitry, and/or code that may enable selection of a cutoff frequency, wherein the LPF may attenuate the amplitudes of input signal components for which the corresponding frequency is higher than the cutoff frequency, while the amplitudes of input signal components for which the corresponding frequency is less than the cutoff frequency may "pass," or not be attenuated, or attenuated to a lesser degree than input signal components at frequencies higher than the cutoff frequency. In various embodiments of the invention, the I LPF 210a may be implemented as a passive filter, such as one that utilizes resistor, capacitor, and/or inductor elements, or implemented as an active filter, such as one that utilizes an operational amplifier. In an exemplary embodiment of the invention, the I LPF 210a may receive a differential input signal and output a differential output signal.

The Q LPF 204b may be substantially similar to the I LPF 204a.

The I DAC 202a may comprise suitable logic, circuitry, and/or code that may enable conversion of an input digital signal to a corresponding analog representation.

The Q DAC 202b may be substantially similar to the I DAC 202a.

The RFLNA 224 may comprise suitable logic, circuitry, and/or code that may enable amplification of weak signals (as measured by dBm, for example), such as received from an antenna. The Input signal may be an RF signal received at an antenna, which is communicatively coupled to the RFLNA 224. The RFLNA 224 may typically be located in close physical proximity to the antenna to avoid further weakening of the signal received at the antenna. In an exemplary embodiment of the invention, the RFLNA 224 may receive a differential input signal and output a differential output signal.

The receiver I mixer 226a may comprise suitable logic, circuitry, and/or code that may enable downconversion of an input signal. The receiver I mixer 226a may utilize an input local oscillator signal labeled as $LO_{226a}$ (in FIG. 2) to downconvert the input signal. The input signal may be an RF signal that may be downconverted to generate a baseband signal, or an intermediate frequency (IF) signal. In general, the receiver I mixer 226a may produce signals for which the frequencies may be the sum and difference of the frequency of the input signal, the frequency of the signal $LO_{226a}$, and/or harmonic frequencies derived from the before mentioned signals. In an exemplary embodiment of the invention, the receiver I mixer 226a may receive a differential input signal and output a differential output signal.

The receiver Q mixer 226b may be substantially similar to the receiver I mixer 226a. The receiver Q mixer 226b may utilize an input local oscillator signal labeled as $LO_{226b}$ (in FIG. 2) to downconvert the input signal.

The I path selector switch 234a may comprise suitable logic, circuitry, and/or code that may enable an input signal to be selectively coupled to one of a plurality of output points. In an exemplary embodiment of the invention, the I path selector switch 234a may select from 2 pairs of differential input signals, coupling the selected differential input signal to a differential output.

The Q path selector switch 234b may be substantially similar to the I path selector switch 234a.

The I HPVGA 228a may comprise suitable logic, circuitry, and/or code that may enable attenuation of input signals to generate an attenuated or amplified output signal, wherein the amount of attenuation or amplification, as measured in dB for example, may be determined based on an input control signal. In various embodiments of the invention, the input control signal may comprise binary bits. In various embodiments of the invention, the HPVGA 228a may provide attenuation levels that range from 0 dB to −30 dB in 3 dB increments. In an exemplary embodiment of the invention, the I HPVGA 228a may receive a differential input signal and output a differential output signal.

The I LPF 230a and Q LPF 230b may be substantially similar to the I LPF 204a.

The I ADC 232a may comprise suitable logic, circuitry, and/or code that may enable conversion of an input analog signal to a corresponding digital representation. The I ADC 232a may receive an input analog signal, which may be characterized by a signal amplitude.

The I ADC 232a may quantize the analog signal by correlating ranges of analog signal level values to corresponding numerical values. The I ADC 232a may determine analog signal levels at distinct time instants by measuring, or integrating, the analog signal level of the input signal during a time interval referred to as δt. The time interval between measurements, or sampling interval, may be determined based on a sampling rate, which is typically long in comparison to the integration time interval δt. In an exemplary embodiment of the invention, the I ADC 232a may receive a differential input signal and output a differential output signal.

The Q ADC 232b may be substantially similar to the I ADC 232a.

The baseband processor 240 may comprise suitable logic, circuitry, and/or code that may enable processing of binary data contained within an input baseband signal. The baseband processor 240 may perform processing tasks, which correspond to one or more layers in an applicable protocol reference model (PRM). For example, the baseband processor 240 may perform physical (PHY) layer processing, layer 1 (L1) processing, medium access control (MAC) layer processing, logical link control (LLC) layer processing, layer 2 (L2) processing, and/or higher layer protocol processing based on input binary data. The processing tasks performed by the baseband processor 240 may be referred to as being within the digital domain. The baseband processor 240 may also generate control signals based on the processing of the input binary data. In an exemplary embodiment of the invention, the baseband processor 240 may receive differential input signals and output differential output signals.

In operation, the baseband processor 240 may generate data comprising a sequence of bits to be transmitted via a wireless communications medium. The baseband processor 240 may generate control signals that configure the RF transmitter 123b to transmit the data. The baseband processor may send a portion of the data, an $I_{BB}$ signal, to the I DAC 202a, and another portion of the data, a $Q_{BB}$ signal, to the Q DAC 202b. The I DAC 202a may receive a sequence of bits and generate an analog signal. The Q DAC 202b may similarly generate an analog signal.

The analog signals generated by the I DAC 202a and Q DAC 202b may comprise undesirable frequency components. The I LPF 204a and Q LPF 204b may attenuate signal amplitudes associated with these undesirable frequency components in signals generated by the I DAC 202a and Q DAC 202b respectively. The baseband processor 240 may configure the transmitter I mixer 208a to select a frequency for the $LO_{208a}$ signal utilized to upconvert the filtered signal from the I LPF 204a. The upconverted signal output from the transmitter I mixer 208a may comprise an I component RF signal. The baseband processor 240 may similarly configure the transmitter Q mixer 208b to generate a Q component RF signal from the filtered signal from the Q LPF 204b.

The RFPGA 210 may amplify the I component and Q component RF signals to generate an RF signal, wherein the level of amplification provided by the RFPGA 210 may be configured based on control signals generated by the baseband processor 240. The PAD 212 may provide a second stage of amplification for the signal generated by the RFPGA 210, and the PA 214 may provide a third stage of amplification for the signal generated by the PAD 212. The amplified signal from the PA 214 may be transmitted to the wireless communications medium via the antenna 121.

The baseband processor 240 may configure the RF receiver 123a and/or RF transmitter 123b for two modes of operation comprising a normal operating mode, and a calibration mode. In the normal operating mode, the RF transmitter 123b may transmit RF signals via the antenna 121, while the RF receiver 123a may receive RF signals via the antenna 121. In the calibration mode, the RF signal output from the RF transmitter 123b may be attenuated, mixed down, and inserted in the RF receiver 121b as a feedback signal. Thus, the calibration mode may enable a closed feedback loop from the baseband processor 240, to the RF transmitter 123b, to a feedback point within the RF receiver 123a, and back to the baseband processor 240.

In a normal operating mode, the baseband processor 240 may generate control signals that enable configuration of the I path selector switch 234a such that I path selector switch 234a may be configured to select an input from the receiver I mixer 226a. The I path selector switch 234a may enable the output signal from the I mixer 226a to be coupled to an input to the I HPVGA 228a. The baseband processor 240 may also generate control signals that enable configuration of the Q path selector switch 234b such that Q path selector switch 234b may be configured to select an input from the receiver Q mixer 226b. The Q path selector switch 234b may enable the output signal from the Q mixer 226b to be coupled to an input to the Q HPVGA 228b. In the normal operating mode, the RF receiver 123a may receive RF signals via the antenna 121. The RFLNA 224 may amplify the received RF signal, which may then be sent to the receiver I mixer 226a and/or receiver Q mixer 226b. The receiver I mixer 226a may downconvert the amplified RF signal. Similarly, the receiver Q mixer 226b may also downconvert the amplified RF signal.

The baseband processor 240 may generate control signals that configure the I HPVGA 228a to amplify a portion of the downconverted signal Output$_{226a}$. In an exemplary embodiment of the invention, the I HPVGA 228a may amplify signal components for which the corresponding frequency may be higher than baseband. Similarly, the baseband processor 240 may generate control signals that configure the Q HPVGA 228b to attenuate a portion of the downconverted signal Output$_{226b}$.

The I LPF 230a may filter the amplified signal received from the I HPVGA 228a such that the output of the I LPF 230a is a baseband signal. The baseband signal may comprise a sequence of symbols. Similarly, the Q LPF 230b may generate a baseband signal. The I ADC 232a may convert an amplitude of a symbol in the baseband signal received from the I LPF 230a to a sequence of bits. Similarly, the Q ADC 232b may convert an amplitude of a symbol in the baseband signal received from the Q LPF 230b to a sequence of bits. The baseband processor 240 may receive the sequence of bits from the I ADC 232a and Q ADC 232b and perform various processing tasks as set forth above.

In the calibration mode, the baseband processor 240 may generate control signals that enable configuration of the I path selector switch 234a and/or Q path selector switch 234b such that I path selector switch 234a and/or Q path selector switch 234b may be configured to select an input from the feedback mixer 220. The I path selector switch 234a may enable the output signal from the feedback mixer 220 to be coupled to an input to the I HPVGA 228a. The Q path selector switch 234b may enable the output signal from the feedback mixer 220 to be coupled to an input to the Q HPVGA 228b. In the exemplary block diagram shown in FIG. 2, the I path selector switch 234a and Q path selector switch 234b are each configured to couple an input signal from the feedback mixer 220, to the inputs for the I HPVGA 228a, and Q HPVGA 228b.

In the calibration mode, the output signal from the PA 214 may be input to the signal attenuation block 218. In the calibration mode, the baseband signals are unmodulated. The signal attenuation block 218 may adjust the amplitude of the RF signal generated by the PA 214 to a level more suitable for input to the feedback mixer 220. The signal attenuation block 218 may be configured by the baseband processor 240 to apply a specified attenuation level to the input signal from the PA 214. The feedback mixer 220 may mix down an attenuated RF signal to generate an Output$_{220}$ signal. In the calibration mode, the I HPVGA 228a and/or Q HPVGA 228b may receive input signals from the feedback mixer 220.

The I LPF 230a may filter the amplified signal received from the I HPVGA 228a such that the output of the I LPF 230a may be based on the baseband component of the Output$_{220}$ signal. Similarly, the Q LPF 230b may generate a baseband signal.

One limitation of the PA 214 is that the output signal may become increasingly distorted as the output power level from the PA 214 increases. The distortion may be detected through AM-AM distortion measurements, and/or AM-PM distortion measurements.

In various embodiments of the invention, the calibration mode may enable the baseband processor 240 to compensate for AM-AM distortion and/or AM-PM distortion. In one aspect of the invention, the calibration mode may enable the baseband processor 240 to send input signals $I_{BB}$ and $Q_{BB}$ to the RF transmitter 123b, from which an RF signal may be generated as an output signal from the PA 214. The output signal from the PA 214 to be attenuated by the signal attenuation block 218, mixed down by the feedback mixer 220, and inserted into the RF receiver 123a path as a feedback signal input to the I HPVGA 228a and/or Q HPVGA 228b. The feedback signal may be processed within the RF receiver 123a path and received as one or more baseband signals, $I_{FB}$ and/or $Q_{FB}$, at the baseband processor 240. The baseband processor 240 may then estimate the AM-AM distortion performance of the PA 214 based on the amplitudes of the $I_{FB}$ and/or $Q_{FB}$ signals, and the amplitudes of the $I_{BB}$ and $Q_{BB}$. The baseband processor 240 may estimate the AM-PM distortion performance of the PA 214 based on the relative phase of the $I_{FB}$ and the $I_{BB}$ signals, and/or the relative phase of the $Q_{FB}$ and $Q_{BB}$ the signals. By estimating the AM-AM distortion performance and/or AM-PM distortion performance of the PA 214 for a range of input power levels for the $I_{BB}$ and $Q_{BB}$ signals, the baseband processor 240 may compute a characterization of the AM-AM performance and/or AM-PM performance of the PA 214 for a range of input power levels and/or output power levels.

After characterizing the AM-AM distortion performance, and/or AM-PM distortion performance of the PA 214, the baseband processor 240 operating in the normal mode may determine an intended output power level, $p_{out\_ideal}$, and/or relative phase, $\phi_{ideal}$, for an output generated by the PA 214 based on original power level, Pin, for the input signals $I_{BB}$ and/or $Q_{BB}$, respectively. The intended output power level and/or relative phase may be based on an ideal PA, which may be linear across the range of input power levels and/or output power levels. The baseband processor 240 may adjust the original power levels and/or relative phase for the input signals $I_{BB}$ and/or $Q_{BB}$ to select adjusted input power levels adj_$p_{in}$ and/or adj_$\phi_{in}$ that produce the intended output power level $p_{out\_ideal}$ and/or relative phase $\phi_{ideal}$ based on the characterization.

The adjustments to the power levels and/or phase adjustments for the input signals may be referred to as distortion of the digital signals, $I_{BB}$ and/or $Q_{BB}$, which may provide compensation for estimated AM-AM and/or AM-PM distortion of signals in the PA 214. These compensatory adjustments on the digital signals may, therefore, be referred to as a digital predistortion scheme, which may be practiced in various embodiments of the invention.

Figure 2B:
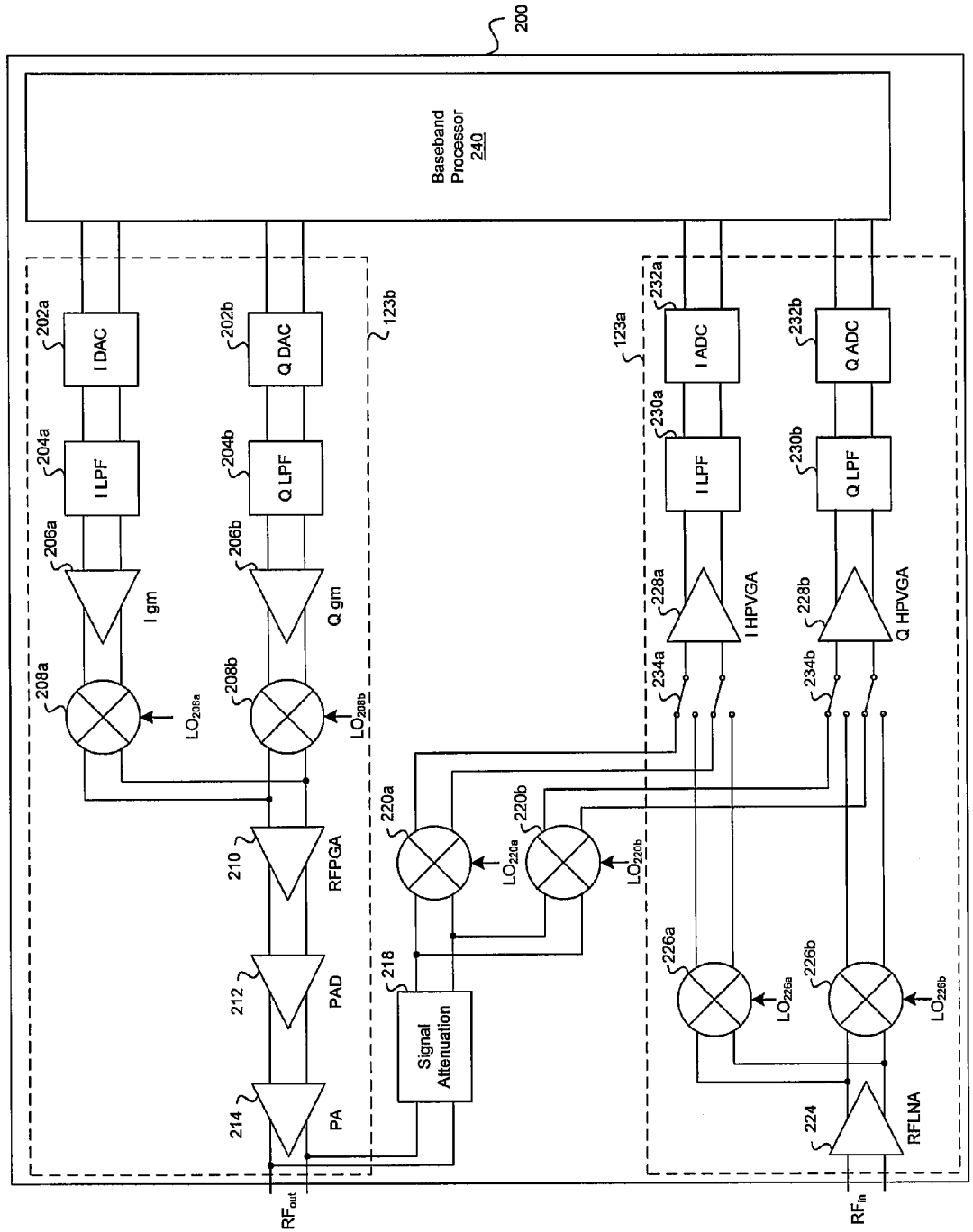
FIG. 2B is an exemplary block diagram illustrating an RF transceiver utilizing feedback for predistortion calibration with quadrature feedback mixers, in accordance with an embodiment of the invention.

FIG. 2B is an exemplary block diagram illustrating an RF transceiver utilizing feedback for predistortion calibration with quadrature feedback mixers, in accordance with an embodiment of the invention. FIG. 2B differs from FIG. 2A in that FIG. 2B shows a feedback path in which quadrature mixers downconvert the feedback signal into I and Q feedback signal components. Referring to FIG. 2B, there is shown a single chip RF transceiver 250. The single chip RF transceiver 250 may comprise an RF receiver 123a, an RF transmitter 123b, a signal attenuation block 218, a feedback I mixer 220a, a feedback Q mixer 220b, and a baseband processor 240. The RF transmitter 123b may comprise a power amplifier (PA) 214, a power amplifier driver (PAD) 212, an RF programmable gain amplifier (RFPGA) 210, a transmitter In-phase signal (I) mixer 208a, a transmitter Quadrature-phase signal (Q) mixer 208b, an I transconductance amplifier (gm) 206a, a Q gm 206b, an I low pass filter (LPF) 204a, a Q LPF 204b, an I digital to analog converter (I DAC) 202a, and a Q DAC 202b. The RF receiver 123a may comprise an RF low noise amplifier (RFLNA) 224, a receiver I mixer 226a, a receiver Q mixer 226b, an I path selector switch 234a, a Q path selector switch 234b, an I high pass variable gain amplifier (HPVGA) 228a, a Q HPVGA 228b, an I LPF 230a, a Q LPF 230b, an I analog to digital converter (DAC) 232a, and a Q DAC 232b.

Figure 3:
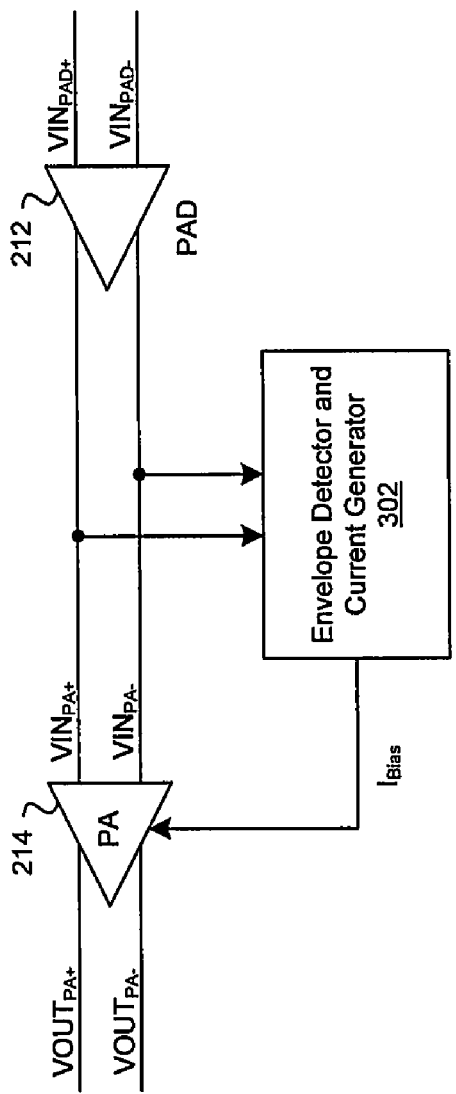
FIG. 3 is a block diagram of an exemplary system for dynamic biasing of a power amplifier, in accordance with an embodiment of the invention.

FIG. 3 is a block diagram of an exemplary system for dynamic biasing of a power amplifier, in accordance with an embodiment of the invention. Referring to FIG. 3, there is shown an envelope detector and current generator block 302, the PAD 212 (FIG. 2), and the PA 214 (FIG. 2).

The envelope detector and current generator block 302 may comprise suitable logic, circuitry and/or code that may enable detection of an amplitude of a time varying input signal. Based on the detected amplitude of the input signal, the envelope detector and current generator block 302 may enable generation of an output current, labeled $I_{Bias}$ in FIG. 3.

In operation, the PAD 212 may receive differential input signals, labeled $VIN_{PAD+}$ and $VIN_{PAD-}$ in FIG. 3. The PAD 212 may amplify the differential input signal and generate a differential output signal. The PA 214 may receive the differential output signal generated by the PAD 212 as a differential input signal, labeled $VIN_{PA+}$ and $VIN_{PA-}$ in FIG. 3. The envelope detector and current generator 302 may also receive the differential output signal generated by the PAD 212 as a differential input signal. The envelope detector and current generator 302 may estimate the amplitude of the differential output signal, or envelope, generated by the PAD 212 and generate a bias current $I_{Bias}$. The bias current, $I_{Bias}$, may be supplied as an input to the PA 214 to enable improvement of the efficiency and/or linearity of the PA 214 when amplifying input signals $VIN_{PA+}$ and $VIN_{PA-}$. The bias current, $I_{Bias}$, may represent the input bias current to the PA 214 in FIG. 2. The PA 214 may amplify the input signals, $VIN_{PA+}$ and $VIN_{PA-}$, and generate a differential output signal, labeled $VOUT_{PA+}$ and $VOUT_{PA-}$ in FIG. 3.

In an exemplary embodiment of the invention, the relationship between the bias current, $I_{Bias}$, generated by the envelope detector and current generator 302, and signal envelope, generated by the PAD 212, may be represented as in the following equation:

$$I_{Bias} = a \cdot X + b \quad [2]$$

where X represents the envelope amplitude, the variable a represents the change in bias current in response to a change in the envelope amplitude, or bias slope, and the variable b represents a constant bias level.

In the right hand side of equation [2], the bias current $I_{Bias}$ is represented as comprising two components. The first term on the right hand side of equation [2], $a \cdot X$, may refer to the component for which the value may vary in response to changes in the value of X. This first term may therefore be referred to as a variable current component of the bias current, $I_{bias}$, and may be represented, $I_{Variable}$. The second term on the right hand side of equation [2], b, may refer to the component for which the value may not vary in response to changes in the value of X. This second term may therefore be referred to as a constant current component of the bias current, and may be represented, $I_{Constant}$.

In various embodiments of the invention, the envelope detector and current generator block 302 may detect a peak amplitude of a differential input signal $VIN_{PA+}$ and $VIN_{PA-}$ to a PA circuit 214. The envelope detector and current generator block 302 may generate a bias current, $I_{Bias}$, for which the amplitude is determined from the input signal envelope as set forth in equation [2]. The bias current may be utilized to establish a bias level, which enables the PA 214 amplify the differential input signal $VIN_{PA+}$ and $VIN_{PA-}$ and generate a differential output signal $VOUT_{PA+}$ and $VOUT_{PA-}$ with increased linearity and/or efficiency in comparison to some alternative PA circuits, which utilize fixed bias levels.

For example, when the peak amplitude of the input signal to the PA 214 decreases, the bias current may also decrease. This may enable the PA 214 to increase efficiency, as set for in equation [1], while also enabling the PA 214 to operate in a portion of the transfer curve to reduce distortion. The reduced bias level may increase efficiency by reducing power dissipation when the PA 214 is in a conducting state. In various embodiments of the invention, the reduced bias level may still be high enough to enable the PA 214 to remain in the conducting state throughout the cycle of the input signal.

When the peak amplitude of the input signal to the PA 214 increases, the bias current may also increase. This may enable the PA 214 to increase linearity by enabling the PA 214 to operate in a portion of the transfer curve to reduce distortion. In various embodiments of the invention, the increased bias level may be low enough to avoid reducing PA efficiency to a greater degree than necessary to achieve linearity objectives for PA 214 operation.

Whether the bias current level is increased or decreased in response to changes in input signal peak amplitude, distortion may be further reduced by predistorting the baseband input signal from the baseband processor 240 to compensate for AM-AM and/or AM-PM distortion introduced as a result of dynamic biasing of the PA circuit 214.

Various embodiments of the invention may enable a PA circuit 214 to operate in a highly efficient and linear manner for output signals across large peak power level to average power level ratios. Aspects of the system may comprise detecting input signal levels to the PA 214 and dynamically adjusting the bias current, $I_{Bias}$, to enable the PA 214 to operate with high efficiency and/or linearity. The output signal generated by the PA 214 in response to the bias current adjustment may be utilized to generate a feedback signal. The feedback signal may be received by the baseband processor 240. The baseband processor 240 may utilize the feedback signal to estimate AM-AM distortion and/or AM-PM distortion levels in the output signal. Based on the estimates for AM-AM distortion and/or AM-PM distortion, the baseband processor 240 may predistort subsequent baseband signals generated by the baseband processor 240. The baseband processor 240 may predistort the baseband signals by performing power level adjustments and/or relative phase adjustments on the subsequent baseband signals as described above. The subsequent generated baseband signals may be utilized by the PA 214 to generate subsequent output signals. The predistortion of the subsequent baseband signals generated by the baseband processor 240 may enable reduction in AM-AM distortion and/or AM-PM distortion levels in subsequent output signals generated by the PA 214.

Figure 4:
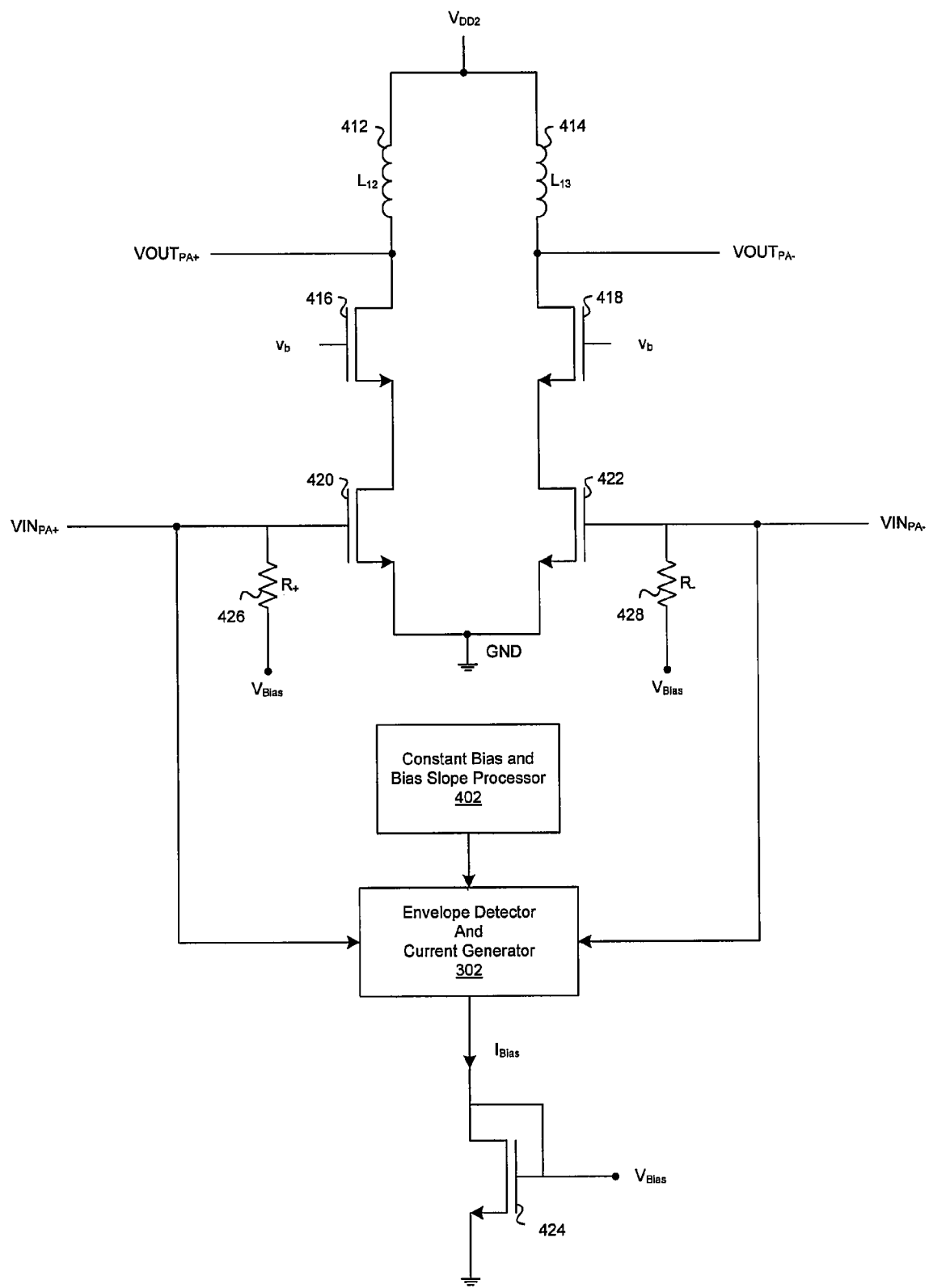
FIG. 4 is a circuit diagram of an exemplary differential amplifier stage with dynamic biasing, in accordance with an embodiment of the invention.

FIG. 4 is a circuit diagram of an exemplary differential amplifier stage with dynamic biasing, in accordance with an embodiment of the invention. Referring to FIG. 4, there is shown a constant bias and bias slope processor 402, the envelope detector and current generator block 302 (FIG. 3), a plurality of transistors 416, 418, 420, 422 and 424, a plurality of inductors 412 and 414, and a plurality of resistors 426 and 428.

The processor 402 may comprise suitable logic, circuitry and/or code that may enable configuration of the envelope detector and current generator block 302 with a value for bias slope (as represented by the variable a in equation [2]) and/or a value for constant current (as represented by the variable b in equation [2]).

The transistors 416 and 420, inductor 412, and resistor 426 may comprise a first half of and exemplary differential amplifier stage. The first half of the differential amplifier stage may receive a positive half of a differential input signal, labeled $VIN_{PA+}$ in FIG. 4, and generate a positive half of a differential output signal, labeled $VOUT_{PA+}$ in FIG. 4.

The transistors 418 and 422, inductor 414, and resistor 428 may comprise a second half of differential amplifier circuit. The second half of the exemplary differential amplifier circuit may receive a negative half of a differential input signal, labeled $VIN_{PA-}$ in FIG. 4, and generate a negative half of a differential output signal, labeled $VOUT_{PA-}$ in FIG. 4.

The signal $v_b$ may represent a control signal coupled to the gate inputs of the transistors 416 and 418, which enables the amplifier stage to generate an output signal $VOUT_{PA}$ in response to an input signal $VIN_{PA}$.

The envelope detector and current generator 302 may receive the differential input signals $VIN_{PA+}$ and $VIN_{PA-}$. The envelope detector and current generator 302 may generate a bias current, $I_{Bias}$, based on the differential input signals $VIN_{PA+}$ and $VIN_{PA-}$. The current $I_{Bias}$ may be computed as set forth in equation [2], where X may represent the differential input signal comprising $VIN_{PA+}$ and $VIN_{PA-}$, and values for constant bias current and bias slope may be configured by the processor 402. The bias current $I_{Bias}$ generated by the envelope detector and current generator 302 may be supplied to the transistor 424. Transistor 424 bias voltage $V_{Bias}$ based on the differential input signals $VIN_{PA+}$ and $VIN_{PA-}$. The bias voltage $V_{Bias}$ is applied to the resistors 426 and 428 to bias the transistors 420 and 422. Consequently, the bias voltage value may change in response to changes in the value of the differential input signals $VIN_{PA+}$ and $VIN_{PA-}$. The bias current, $I_{Bias}$, in FIG. 5, may represent the input bias current to the PA 214 in FIG. 2.

Figure 5:
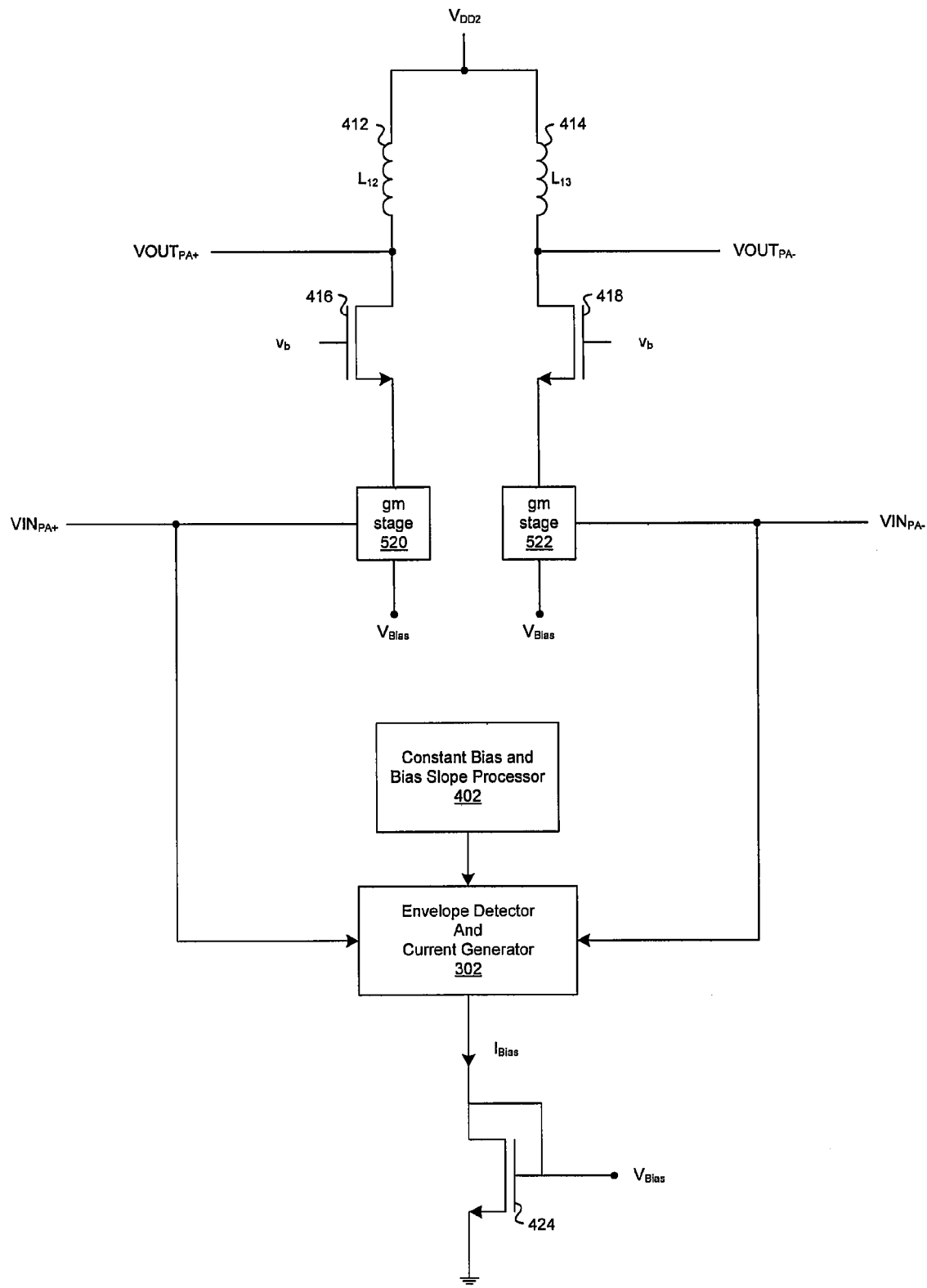
FIG. 5 is a circuit diagram of an exemplary differential transconductance amplifier stage with dynamic biasing, in accordance with an embodiment of the invention.

FIG. 5 is a circuit diagram of an exemplary differential transconductance amplifier stage with dynamic biasing, in accordance with an embodiment of the invention. Referring to FIG. 5, there is shown the constant bias and bias slope processor 402 (FIG. 4), the envelope detector and current generator block 302 (FIG. 3), the plurality of transistors 416, 418 and 424 (FIG. 4), a plurality of transconductance (gm) stages 520 and 522, and the plurality of inductors 412 and 414 (FIG. 4).

In FIG. 5, the transistor 420 and resistor 426 is replaced by a gm stage 520, and the transistor 422 and resistor 428 is replaced by a gm stage 522. An exemplary gm stage may be represented by an offset biased differential pairs. The dynamic biasing method and system utilized in the exemplary differential transconductance amplifier circuit of FIG. 5 may be substantially similar to the dynamic biasing method and system described in FIG. 4.

Various embodiments of the invention may not be limited to detecting signal envelopes at the output of a PAD circuit 212, and/or at the input of a PA circuit 214. The signal envelope may be detected at in the RF transmitter 123b path. For example, in an alternative embodiment of the invention, the signal envelope could be detected at the input of the PAD 212, or at the input of the RFPGA 210. Similarly, various embodiments of the invention may not be limited to detecting signal envelopes at a single point in the RF transmitter 123b path. For example, the envelope detector and current generator block 302 may detect signal envelopes at both the input to the PA 214 and at the input to the PAD 212, where the bias current, $I_{Bias}$, input to the PA 214 may be determined based on some combination of peak signal levels detected at the plurality of input points.

Figure 6:
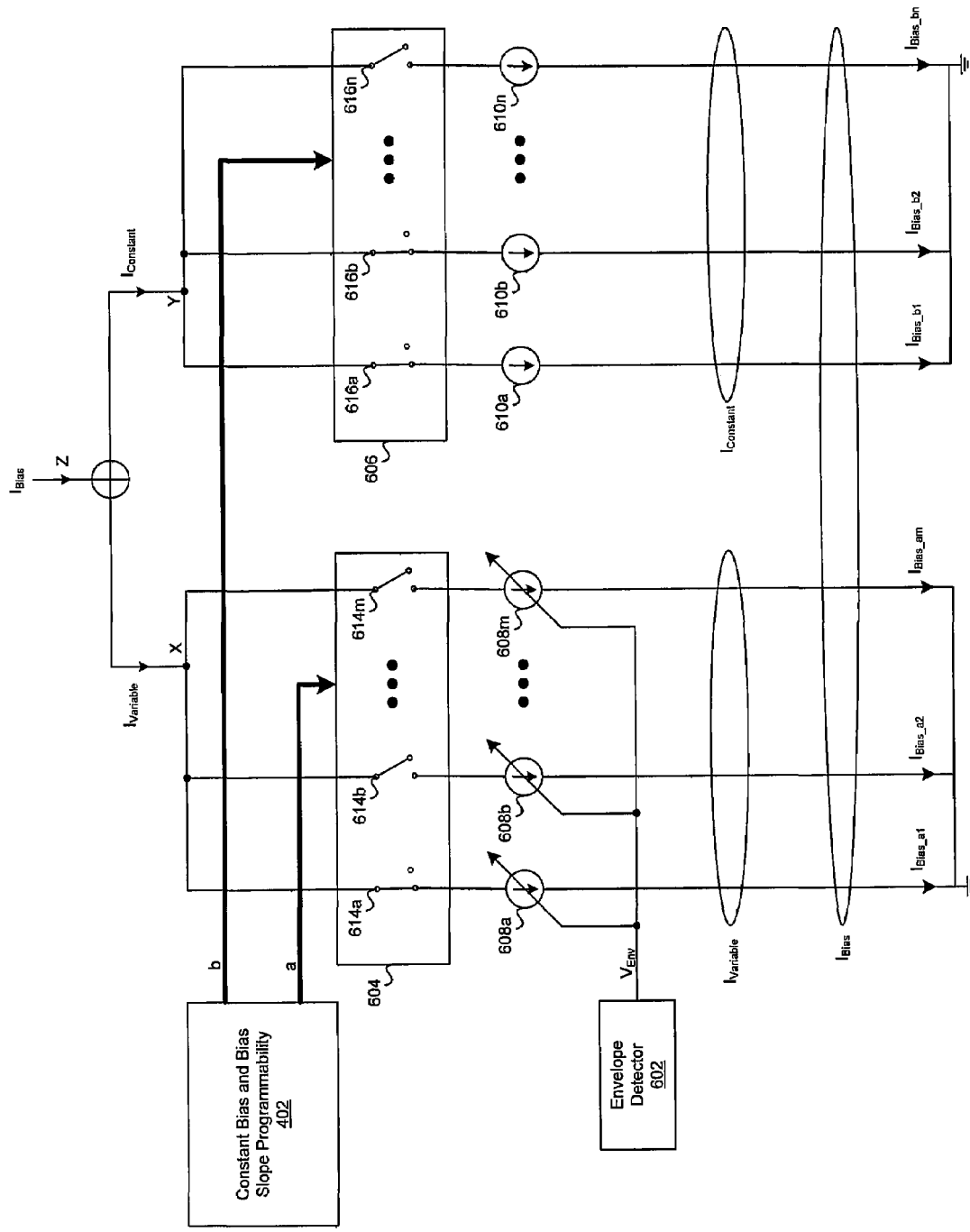
FIG. 6 is a block diagram of an exemplary system for envelope detection and dynamic bias current generation, in accordance with an embodiment of the invention.

FIG. 6 is a block diagram of an exemplary system for envelope detection and dynamic bias current generation, in accordance with an embodiment of the invention. Referring to FIG. 6, there is shown an envelope detector 602, the constant bias and bias slope processor 402 (FIG. 4), switches 604 and 606, a first plurality of current generator circuits 608a, 608b, ... and 608m, and a second plurality of current generator circuits 610a, 610b, ... and 610n. The switch 604 may comprise a plurality of control switches 614a, 614b, ... and 614m. The switch 606 may comprise a plurality of control switches 616a, 616b, ... and 616n. In various embodiments of the invention, the number of current generator circuits in the first plurality of current generator circuits 608a, 608b, ... and 608m may or may not be equal to the number of current generator circuits in the second plurality of current generator circuits 610a, 610b, ... and 610n.

The switch 604 may comprise suitable logic, circuitry and/or code that may enable selection of one or more of the current generator circuits 608a, 608b, ... and 608m. For example, the control switch 614a may be enabled to select the current generator circuit 608a. All selected current generator circuits under the control of switch box 604 are combined at node X. Similarly all selected current generator circuits (one or more of 610a, 610b, ..., 610n) under the control of switch box 606 are combined at node Y.

Each of the control switches 614a, 614b, ... and 614m within the switch 604 may be individually configured to be open or closed. When a control switch is open, node X may be electrically isolated from the corresponding current generator circuit. When a control switch is closed, node X may be electrically shorted to the corresponding current generator circuit. For example, in FIG. 6, the control switch 614a is shown to be closed, thereby connecting to node X, and the current generator circuit 608a. By contrast, the control switch 614b is shown to be open, thereby isolating node X and the current generator circuit 608b.

The switch 604 may be configured to open or close individual control switches 614a, 614b, ... and 614n based on an input control signal from the processor 402. The input control signal may correspond to a value for the bias slope variable, a, as set forth in equation [2].

The switch 606 may comprise suitable logic, circuitry and/or code that may enable selective coupling of node Y to one or more of the current generator circuits 610a, 610b, ... and 610m. Each of the control switches 616a, 616b, ... and 616m within the switch 606 may be coupled to the node Y and a corresponding one of the second plurality of current generator circuits 610a, 610b, ... and 610m. For example, the control switch 616a may be coupled node Y and to the current generator circuit 610a.

Each of the control switches 616a, 616b, ... and 616m within the switch 606 may be individually configured to be open or closed. When a control switch is open, node Y may be electrically isolated from the corresponding current generator circuit. When a control switch is closed, node Y may be electrically shorted to the corresponding current generator circuit. For example, in FIG. 6, the control switch 616a is shown to be closed, thereby connecting to node Y and the current generator circuit 610a. By contrast, the control switch 616n is shown to be open, thereby isolating node Y and the current generator circuit 610n.

The switch 606 may be configured to open or close individual control switches 616a, 616b, ... and 616m based on an input control signal from the processor 402. The input control signal may correspond to a value for the constant bias level variable, b, as set forth in equation [2].

The current generator circuit 608a may comprise suitable logic, circuitry and/or code that may enable generation of a variable amplitude bias current, $I_{Bias\_b1}$, the amplitude value of which may depend upon an input voltage signal, labeled $V_{ENV}$ in FIG. 6, and whether the current generator circuit 608a is connected to node X. When the current generator circuit 608a is connected to node X, the value of the bias current, $I_{Bias\_a1}$, may be proportional to the value $V_{ENV}$. When the current generator circuit 608a is isolated from node X, the value of the bias current, $I_{Bias\_a1}$, may be substantially zero (0).

The current generator circuit 608b may be substantially similar to the current generator circuit 608a. The current generator circuit 608b may enable generation of a bias current $I_{Bias\_a2}$.

The current generator circuit 608m may be substantially similar to the current generator circuit 608a. The current generator circuit 608m may enable generation of a bias current $I_{Bias\_am}$.

The current generator circuit 610a may comprise suitable logic, circuitry and/or code that may enable generation of a fixed amplitude bias current, $I_{Bias\_b1}$, depending upon whether the current generator circuit 610a is connected to node Y. When the current generator circuit 610a is connected to node Y, the current generator circuit 610a may enable generation of the fixed amplitude bias current, $I_{Bias\_b1}$. When the current generator circuit 610a is isolated from node Y, the value of the bias current, $I_{Bias\_b1}$, may be substantially zero (0).

The current generator circuit 610b may be substantially similar to the current generator circuit 610a. The current generator circuit 610b may enable generation of a bias current $I_{Bias\_b2}$.

The current generator circuit 610n may be substantially similar to the current generator circuit 610a. The current generator circuit 610n may enable generation of a bias current $I_{Bias\_bn}$.

The total current generated by the first plurality of current generator circuits 608a, 608b, ... and 608m may be represented by the variable bias current component of $I_{Bias}$, $I_{Variable}$, as set forth in equation [2], and as labeled in FIG. 6.

The total current generated by the second plurality of current generator circuits 610a, 610b, ... and 610n may be represented by the constant bias current component of $I_{Bias}$, $I_{Constant}$, as set forth in equation [2], and as labeled in FIG. 6.

The total current generated by the first plurality of current generator circuits 608a, 608b, ... and 608m and the second plurality of current generator circuits 610a, 610b, ... and 610n may be represented by the bias current $I_{Bias}$, as set forth in equation [2], and as labeled in FIG. 6.

By configuring the control switch 604 to open or close individual control switches 614a, 614b, ... and 614m, the processor 402 may enable the bias slope to increase in units of $I_{Bias\_ai}$, where i refers to the current generated by an individual current generator circuit 608a, 608b, ... and 608m. Thus, as more control switches are closed in the control switch 604, the value of the bias slope variable, a, may correspondingly increase, and the bias current, $I_{Bias}$, may change more rapidly in response to changes in input signal envelope magnitude. Conversely, as more switches are opened in the control switch 604, the value of the bias slope variable a may correspondingly decrease, and the bias current may change more slowly in response to changes in the input signal envelope magnitude.

By configuring the control switch 606 to open or close individual control switches 616a, 616b, ... and 616m, the processor 402 may enable the constant bias current to increase in units of $I_{Bias\_bji}$, where j refers to the current generated by an individual current generator circuit 610a, 610b, ... and 610m. Thus, as more control switches are closed in the control switch 606, the value of the constant bias current variable, b, may correspondingly increase, and the bias current, $I_{Bias}$, may increase in value for a given input signal envelope magnitude. Conversely, as more switches are closed in the control switch 606, the value of the constant bias current variable, b, may correspondingly decrease, and the bias current may decrease in value for a given the input signal envelope magnitude.

And finally, combining the net currents $I_{variable}$ and $I_{constant}$ at nodes X and Y, we get the net current $I_{bias}$ at node Z.

Figure 7:
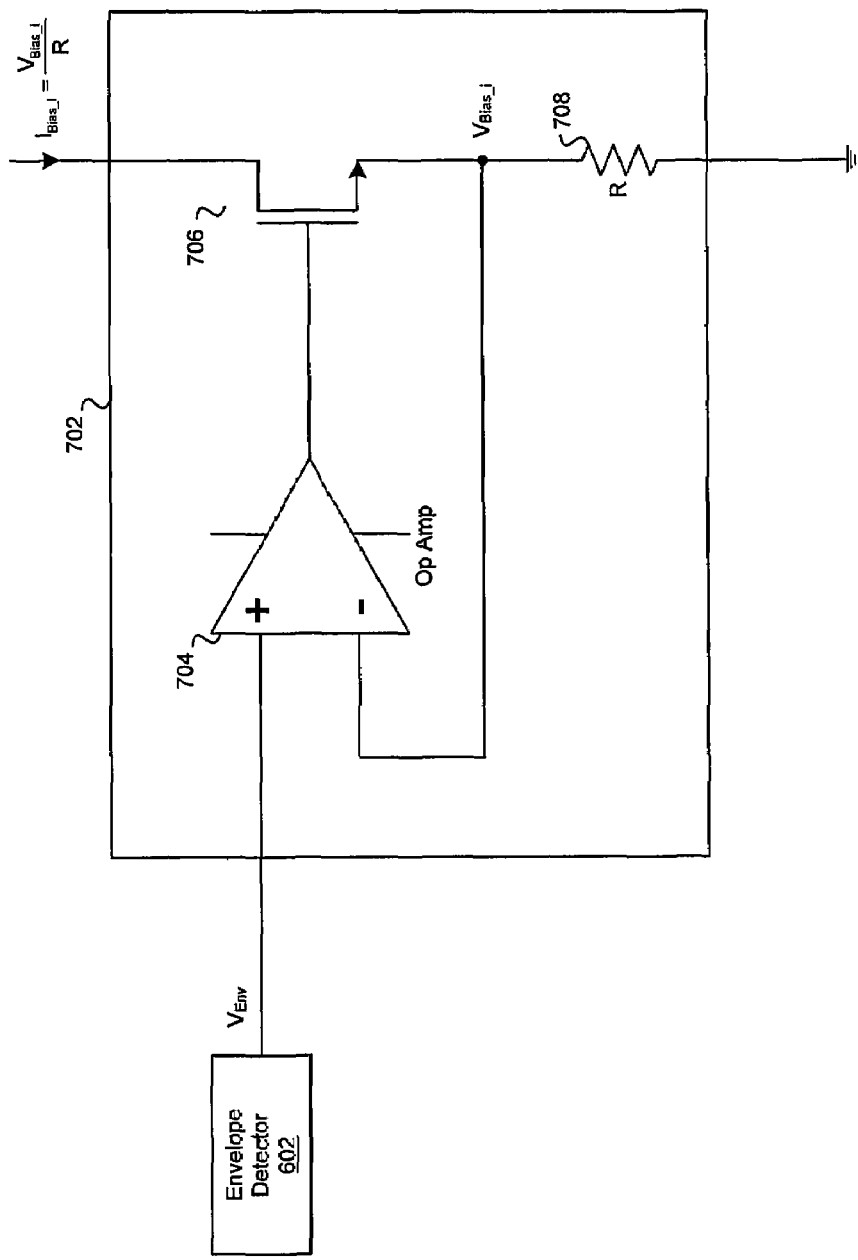
FIG. 7 is a diagram of an exemplary dynamic bias current generator circuit, in accordance with an embodiment of the invention.

FIG. 7 is a diagram of an exemplary dynamic bias current generator circuit, in accordance with an embodiment of the invention. Referring to FIG. 7, there is shown the envelope detector 602 (FIG. 6), and a current generator circuit 702. The current generator circuit 702 may comprise an operational amplifier (op amp) 704, a transistor 706, and a resistor 708. The current generator circuit 702 may represent an individual current generator circuit 608a, 608b, ... and 608m, and/or 610a, 610b, ... and 610n in FIG. 6.

In operation, the current generator circuit 702 may receive an input voltage signal $V_{ENV}$. The op amp 704 may generate an output signal based on the voltage difference between $V_{ENV}$ and a voltage level at the node labeled $V_{Bias\_i}$. The output signal from the op amp 704 may comprise and voltage level and/or current level that may be applied as an input signal to gate terminal of the transistor 706. The input signal to the transistor 706 may cause the transistor 706 to enter a conducting state. In the conducting state, the transistor 706 may enable a current to flow from the drain terminal to the source terminal. For a high input impedance and high gain op amp 704, the voltage level at the node $V_{Bias\_i}$ may be represented as in the following equation:

$$V_{Bias\_i} \approx V_{ENV} \qquad [3]$$

and the current generated by the current generator circuit 702, $I_{Bias\_i}$, may be represented as in the following equation;

$$I_{Bias\_i} \cong \frac{V_{ENV}}{R} \qquad [4]$$

where R represents the resistance value of the resistor 708.

In various embodiments of the invention, the input bias to the PA 214 may comprise a determined bias current level, $I_{Bias}$, instead of a determined bias voltage level. This enables biasing of the PA 214 to be performed in the current domain, instead of in the voltage domain. Performing biasing of the PA 214 in the current domain may enable bias adjustments to occur more quickly than may be the case with voltage domain biasing. Quicker bias adjustments may enable the PA 214 to respond more quickly to changes in envelope magnitude. A potential benefit of quicker bias adjustments in the PA 214 is that various embodiments of the invention may provide more predictable dynamic biasing responses to changes in envelope magnitude and add minimal frequency response from the bias generation circuitry. By contrast, in dynamic biasing approaches that respond more slowly to changes in envelope magnitude, the magnitude of the input signal may have changed by the time that a dynamic bias response has been generated. One potential limitation of such slow response mechanisms is that the dynamic bias response may be inappropriate for the current envelope magnitude of the input signal. As a consequence, the efficacy of the dynamic biasing scheme could be compromised and/or excessive AM-AM AM-PM distortion could be introduced with no benefit in efficiency improvement.

FIG. 8A is a graph illustrating exemplary voltage gain in a power amplifier circuit without dynamic biasing, which may be utilized in connection with an embodiment of the invention. Referring to FIG. 8A, the graph 802 shows voltage gain for a range of input power levels. The input power level, measured in dBm in FIG. 8A, may be measured at the input to the PA circuit. The output voltage $VOUT_{PA}$ may be measured at the output from the PA circuit, while the input voltage $VIN_{PA}$ may be measured at the input to the PA. The voltage gain in FIG. 8A may be computed by computing $VOUT_{PA}$ in units of dBm, and subtracting the value $VIN_{PA}$, also computed in units of dBm.

The graph 802 shows a voltage gain curve for which the PA may be biased utilizing a fixed bias level to operate in the linear portion of the transfer curve for which AM-AM distortion may be small. The graph 802 may be similar to a voltage gain curve for a Class A PA circuit, where the gain may be high for low input power levels, and decrease gradually for higher input power levels for which the power supply voltage level may limit the amount of gain attainable in the linear portion of the transfer curve.

FIG. 8B is a graph illustrating exemplary output phase in a power amplifier circuit without dynamic biasing, which may be utilized in connection with an embodiment of the invention. Referring to FIG. 8B, the graph 804 shows output phase for a range of input power levels for a PA circuit, which may be biased utilizing a fixed bias level. In FIG. 8B, the input power level may be measured as described in FIG. 8A. The output phase may be measured in degrees and may be computed by determining the phase of $VOUT_{PA}$ and subtracting the phase of $VIN_{PA}$. The graph 804 may be utilized to measure AM-PM distortion in a PA circuit.

FIG. 9A is a graph illustrating exemplary voltage gain in a power amplifier circuit with dynamic biasing, in accordance with an embodiment of the invention. Referring to FIG. 9A, the graph 902 shows voltage gain for a range of input voltage levels. The horizontal axis in FIG. 9A comprises a range of magnitude values for the input voltage signal to the PA 214, $\|VIN_{PA}\|$, measured in volts. The voltage gain in FIG. 9A is measured as described in FIG. 8A.

The graph 902 shows a voltage gain curve for which the PA 214 may be biased utilizing dynamic bias as described above. The bias level may be selected to enable the PA 214 operate in the linear portion of the transfer curve, for which AM-AM distortion may be small, but with higher efficiency than may be achieved in a Class A operating mode for at least a portion of the input voltage range.

The graph 902 shows lower voltage gain for lower input signal levels $\|VIN_{PA}\|$, and higher voltage gain as the input signal levels $\|VIN_{PA}\|$ increase. In various embodiments of the invention, dynamic biasing may reduce the bias current, $I_{Bias}$, for smaller input signal levels when output voltage gain, as measured in dBm, is relatively small. In this aspect of the invention, dynamic biasing may result in reduced bias current levels to reduce excess gain, which is not needed from the PA 214 to achieve higher efficiency, where efficiency may be as defined in equation [1]. As the input signal levels increase, dynamic biasing may result in increased bias current levels to increase gain when higher levels of output gain are needed.

In various embodiments of the invention, the shape of the graph 902 may be selectable based on values generated by the constant bias and bias slope processor 402. For smaller input signal levels $\|VIN_{PA}\|$, the value for voltage gain may be determined primarily based upon the value of the constant bias level variable, b, from equation [2]. For example, by increasing the value of the variable b, the voltage gain may increase in proportion to the increase in the variable b for smaller input signal levels $\|VIN_{PA}\|$. For larger input signal levels $\|VIN_{PA}\|$, the value for the voltage gain may be determined primarily based upon the value of the bias slope variable, a, from equation [2]. For example, by increasing the value for the variable a, the voltage gain may increase in proportion to the increase in the variable a for larger input signal levels $|VIN_{PA}\|$.

FIG. 9B is a graph illustrating exemplary output phase in a power amplifier circuit with dynamic biasing, in accordance with an embodiment of the invention. Referring to FIG. 9B, graph 904 shows output phase for a range of input signal levels $\|VIN_{PA}\|$. The output phase may be computed as described for FIG. 8B. The graph 904 may be utilized to measure AM-PM distortion in the PA 214.

In various embodiments of the invention, predistortion methods, such as described above, may be utilized to reduce AM-AM distortion and/or AM-PM distortion resulting from dynamic biasing of the PA 214.

FIG. 10A is a graph illustrating exemplary efficiency for a power amplifier circuit without dynamic biasing, which may be utilized in connection with an embodiment of the invention. Referring to FIG. 10A, graph 1002 shows efficiency for a PA circuit biased utilizing a fixed bias level for a range of magnitude values for the output voltage signal from the PA, $\|VOUT_{PA}\|$. The efficiency may be measured based on a continuous wave (CW) input signal, for example a sine wave signal, and may be computed as shown in equation [1].

The graph 1002 shows that the efficiency of the exemplary PA, which does not utilize dynamic biasing is less than 1% for a 5 dBm output voltage level $\|VOUT_{P4}\|$.

FIG. 10B is a graph illustrating exemplary efficiency for a power amplifier circuit with dynamic biasing, in accordance with an embodiment of the invention. Referring to FIG. 10B, graph 1004 shows efficiency for a range of values $\|VOUT_{P4}\|$. The efficiency may be measured as described in FIG. 10A. The graph 1004 shows that the efficiency of an exemplary PA 214, which utilizes dynamic biasing in accordance with various embodiments of the invention, may be 2% for a 5 dBm output voltage level $\|VOUT_{P4}\|$.

Figure 11:
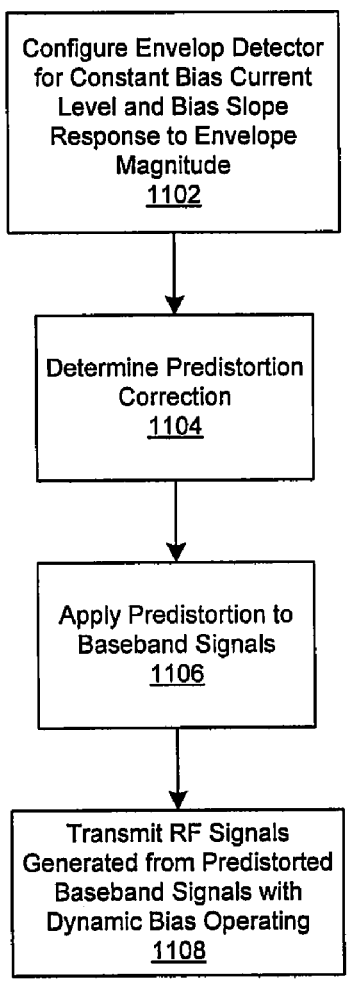
FIG. 11 is a flow chart illustrating an exemplary dynamic biasing and predistortion, in accordance with an embodiment of the invention.

FIG. 11 is a flow chart illustrating an exemplary dynamic biasing and predistortion, in accordance with an embodiment of the invention. Referring to FIG. 11, in step 1102, the constant bias and bias slope processor 402 may configure the envelope detector and current generator block 302. The configuration may comprise a constant bias current value and bias slope value. In step 1104, the baseband processor 240 may determine a predistortion correction as described above. In step 1106, the baseband processor 240 may apply predistortion to generated baseband signals. In step 1108, RF signals may be generated based on the predistorted baseband signals while the dynamic bias method, as described above, is operating. The generated RF signals may be transmitted.

Aspects of a method and system for a highly efficient power amplifier (PA) utilizing dynamic biasing and predistortion may include a processor 402 that enables computation of a value of a variable bias component of a bias current based on a bias slope value and an amplitude of an envelope input signal. The processor 402 may enable computation of a value of the bias current based on the selected constant bias current component value and the variable bias current component value. A PA 214 may enable generation of an output signal by utilizing the bias current to amplify an amplifier input signal, which may be generated based on the envelope input signal.

The processor 402 may enable generation of the constant bias current component from individual constant current generator circuits 610a, which are selected from a plurality of constant current generator circuits. The selection of the individual constant current generator circuits 610a may be based on the selected value of the constant bias current component. Each of the selected individual constant current generator circuits 610a may generate a constant current unit. A value of the constant current unit may be proportional to a constant input voltage to each of the selected individual constant current generator circuits 702. The value of the constant bias current component may be equal to a total of the constant current units from the selected individual constant current generator circuits 610a.

The processor 402 may enable generation of the variable bias current component from individual variable current generator circuits 608a, which are selected from a plurality of variable current generator circuits. The selection of the individual variable current generator circuits 608a may be based on the selected bias slope value. Each of the selected individual variable current generator circuits 608a may generate a variable current unit. A value of the variable current unit may be proportional to the amplitude of the envelope input signal to each of the selected individual constant current generator circuits 702. The value of the variable bias current component may be equal to a total of the variable current units from the selected individual variable current generator circuits 608a.

The envelope detector and current generator 302 may enable adjustment of the value of the applied bias current in response to a change in the amplitude of the envelop input signal. The feedback mixer 220 may enable generation of a feedback signal based on the generated output signal. The baseband processor 240 may enable adjustment of an input power level, and/or relative phase, of an input baseband signal based on the generated feedback signal. The RF transmitter 123b may enable generation of a subsequent output signal based on the adjusted input baseband signal.

In various embodiments of the invention, AM-AM distortion and/or AM-PM distortion that may result from dynamic gain adjustment may be reduced by utilizing a calibration feedback and input predistortion method as is described in U.S. patent application Ser. No. 11/618,876, which is incorporated herein by reference in its entirety.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for biasing of a power amplifier circuit, the method comprising:
   computing a value for a variable bias current based on a selected bias slope value;
   generating an output signal by amplifying an amplifier input signal, wherein a level for said amplifying is determined based on at least said variable bias current, wherein a level for said variable bias current is determined based on said computed value; and
   computing a value for a total bias current based on said variable bias current value and a selected value for a constant bias current.

2. The method according to claim 1, comprising generating said constant bias current from individual constant current generator circuits selected from a plurality of constant current generator circuits.

3. The method according to claim 2, comprising selecting said individual constant current generator circuits based on said selected constant bias current value.

4. The method according to claim 2, wherein each of said selected individual constant current generator circuits generates a constant current level.

5. The method according to claim 4, wherein a value for said constant current level is proportional to a constant voltage level, wherein said constant voltage level is input to said each of said selected individual constant current generator circuits.

6. The method according to claim 4, wherein said selected value for said constant bias current is equal to a summation of said constant current level values from said selected individual constant current generator circuits.

7. The method according to claim 1, comprising generating said variable bias current based on an envelope amplitude level.

8. The method according to claim 7, comprising generating said envelope amplitude level based on said amplifier input signal.

9. The method according to claim 1, comprising generating said variable bias current from individual variable current generator circuits selected from a plurality of variable current generator circuits.

10. The method according to claim 9, comprising selecting said individual variable current generator circuits is based on said selected bias slope value.

11. The method according to claim 9, wherein each of said selected individual variable current generator circuits generates a variable current level.

12. The method according to claim 11, wherein a value of said variable current level is proportional to an envelope amplitude level, wherein said envelope amplitude level is input to said each of said selected individual variable current generator circuits.

13. The method according to claim 12, comprising adjusting said variable current level in response to a change in said envelope amplitude level.

14. The method according to claim 11, wherein said variable bias current value is equal to a summation of said variable current level values from said selected individual variable current generator circuits.

15. The method according to claim 1, comprising generating one or more feedback signals based on said generated output signal.

16. The method according to claim 15, comprising predistorting one or more input baseband signals, based on said generated one or more feedback signals.

17. The method according to claim 16, comprising generating one or more subsequent amplifier input signals based on said predistorted one or more input baseband signals.

18. The method according to claim 17, comprising generating one or more subsequent output signals based on said one or more subsequent amplifier input signals.

19. A system for biasing of a power amplifier circuit, the system comprising:
one or more circuits that enable computation of a value for a variable bias current based on a selected bias slope value;
said one or more circuits enable generation of an output signal by amplifying an amplifier input signal, wherein a level for said amplifying is determined based on at least said variable bias current, wherein a level for said variable bias current is determined based on said computed value; and
said one or more circuit enable computation of a value for a total bias current based on said variable bias current value and a selected value for a constant bias current.

20. The system according to claim 19, wherein said one or more circuit enable generation of said constant bias current from individual constant current generator circuits selected from a plurality of constant current generator circuits.

21. The system according to claim 20, wherein said one or more circuit enable selection of said individual constant current generator circuits based on said selected constant bias current value.

22. The system according to claim 20, wherein each of said selected individual constant current generator circuits generates a constant current level.

23. The system according to claim 22, wherein a value for said constant current level is proportional to a constant voltage level, wherein said constant voltage level is input to said each of said selected individual constant current generator circuits.

24. The system according to claim 22, wherein said selected value for said constant bias current is equal to a summation of said constant current level values from said selected individual constant current generator circuits.

25. The system according to claim 19, wherein said one or more circuit enable generation of said variable bias current based on an envelope amplitude level.

26. The system according to claim 25, wherein said one or more circuit enable generation of said envelope amplitude level based on said amplifier input signal.

27. The system according to claim 19, wherein said one or more circuit enable generation of said variable bias current from individual variable current generator circuits selected from a plurality of variable current generator circuits.

28. The system according to claim 27, wherein said one or more circuit enable selection of said individual variable current generator circuits is based on said selected bias slope value.

29. The system according to claim 27, wherein each of said selected individual variable current generator circuits generates a variable current level.

30. The system according to claim 29, wherein a value of said variable current level is proportional to an envelope amplitude level, wherein said envelope amplitude level is input to said each of said selected individual variable current generator circuits.

31. The system according to claim 30, wherein said one or more circuit enable adjustment of said variable current level in response to a change in said envelope amplitude level.

32. The system according to claim 29, wherein said variable bias current value is equal to a summation of said variable current level values from said selected individual variable current generator circuits.

33. The system according to claim 19, wherein said one or more circuit enable generation of one or more feedback signals based on said generated output signal.

34. The system according to claim 33, wherein said one or more circuit enable predistortion of one or more input baseband signals, based on said generated one or more feedback signals.

35. The system according to claim 34, wherein said one or more circuit enable generation of one or more subsequent amplifier input signals based on said predistorted one or more input baseband signals.

36. The system according to claim 35, wherein said one or more circuit enable generation of one or more subsequent output signals based on said one or more subsequent amplifier input signals.

* * * * *